(12) United States Patent
Lin

(10) Patent No.: US 6,660,458 B2
(45) Date of Patent: Dec. 9, 2003

(54) METHOD OF OPTICAL PROXIMITY CORRECTION

(75) Inventor: Shun-Li Lin, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 169 days.

(21) Appl. No.: 09/895,552

(22) Filed: Jun. 28, 2001

(65) Prior Publication Data

US 2002/0168593 A1 Nov. 14, 2002

(30) Foreign Application Priority Data

May 8, 2001 (TW) .......................... 90110906 A

(51) Int. Cl.[7] .............................. G03F 7/00; G03F 7/20; G03B 27/72
(52) U.S. Cl. .......................... 430/322; 430/30; 430/51; 430/296; 430/396; 355/71
(58) Field of Search ................... 430/30, 51, 322, 430/396, 296; 355/71

(56) References Cited

U.S. PATENT DOCUMENTS

| | | | | |
|---|---|---|---|---|
| 5,673,103 A | * | 9/1997 | Inoue et al. | 355/71 |
| 5,777,744 A | * | 7/1998 | Yoshii et al. | 356/372 |
| 6,472,108 B1 | * | 10/2002 | Lin | 430/5 |
| 2002/0158214 A1 | * | 10/2002 | Lin et al. | 250/548 |
| 2002/0160314 A1 | * | 10/2002 | Lin et al. | 430/322 |
| 2002/0168593 A1 | * | 11/2002 | Lin | 430/322 |

FOREIGN PATENT DOCUMENTS

JP          11-213435     *   8/1999

* cited by examiner

Primary Examiner—Mark F. Huff
Assistant Examiner—Nicole Barreca
(74) Attorney, Agent, or Firm—J. C. Patents

(57) ABSTRACT

A method of optical proximity correction, suitably applied to a photolithography process with a high numeric aperture. The exposure light comprises a P-polarized light and an S-polarized light perpendicular to the P-polarized light. The P-polarized light has a transmission coefficient larger than that of the S-polarized light. In this method, different optical proximity correction modes are applied to the patterns with different orientations. While correcting any pattern, the ratio of transmission coefficient of the P-polarized light to the S-polarized light and the polarization angle between the pattern orientation and the polarization direction of the P-polarization/S-polarization light are considered.

21 Claims, 2 Drawing Sheets

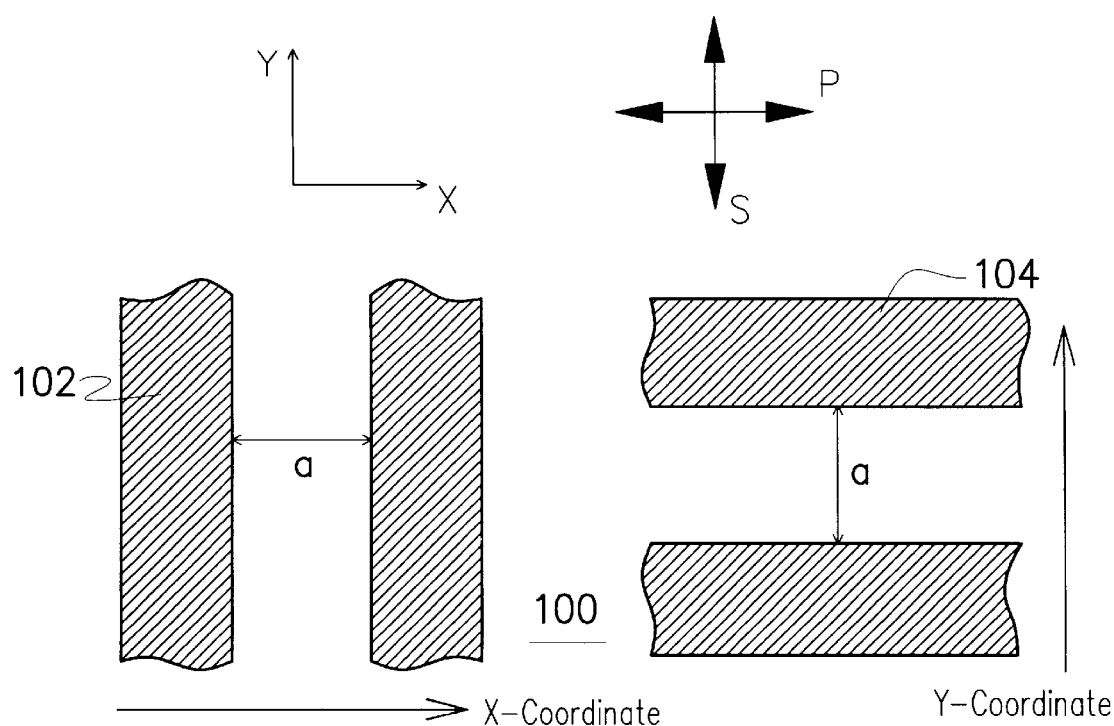
FIG. 1 (PRIOR ART)
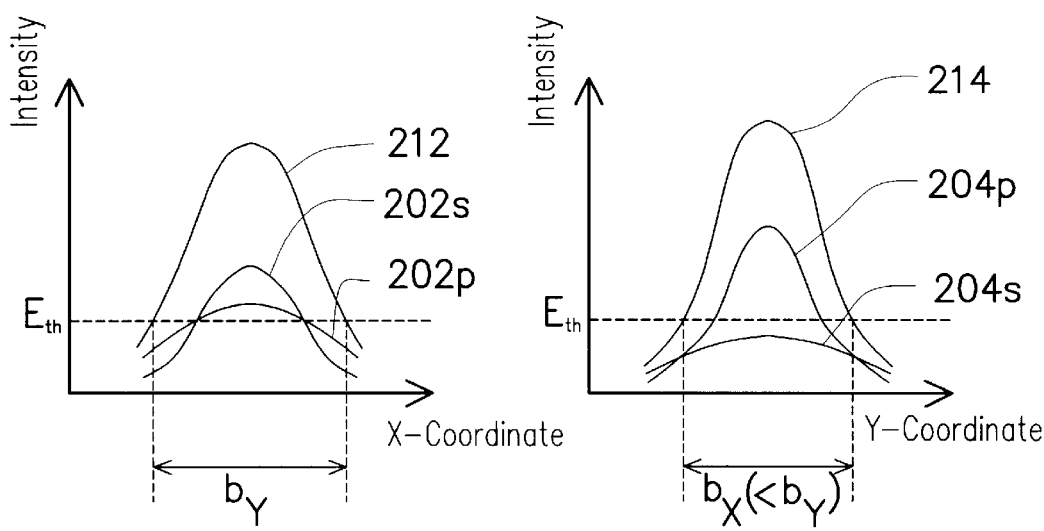
FIG. 2A (PRIOR ART)
FIG. 2B (PRIOR ART)

METHOD OF OPTICAL PROXIMITY CORRECTION

CROSS-REFERENCE TO RELATED APPLICATION

This application claims the priority benefit of Taiwan application serial no. 90110906, filed May 8, 2001.

BACKGROUND OF THE INVENTION

1. Field of the Invention

The invention relates in general to a photolithography process, and more particularly, to a method of optical proximity correction (OPC).

2. Description of the Related Art

As the integration of semiconductor devices becoming higher and higher, the resolution of photolithography process becomes more and more demanding. The analyzable minimum dimension (R) is defined as: $R=k_1 \lambda/NA$ ($\lambda$ is the wavelength, and NA is the numerical aperture of the optical system). From the above equation, it is known that the larger the numerical aperture is, the higher the resolution is. The numerical aperture of the exposure optical system used in the current photolithography process is thus gradually increased.

When the numerical aperture increases over 0.7, pattern deformation is caused by the following two reasons.

1. The exposure light adopted for exposure process is the polarized light. The polarized light includes the P-polarized and S-polarize lights perpendicular to each other in electromagnetic polarization direction. When the numerical aperture is smaller than 0.7, the transmission coefficient of these two polarized lights is the same. However, when the numerical aperture reaches 0.7, the transmission coefficient of the P-polarized light is larger than that of the S-polarized light. The difference is even larger as the numerical aperture increases further.

2. For a pattern with a certain orientation, the P-polarized light and S-polarized light through the photomask cause different intensity profiles of the photoresist layer. The total intensity profile of the photoresist pattern is thus determined by a sum of the intensity profiles of the P- and S-polarized lights.

When the numerical aperture is smaller than 0.7, the transmission coefficients for the P-polarized light and the S-polarized light are the same. Whatever the orientation of the pattern is, the pitch and size of obtained photoresist pattern are not changed accordingly. However, when the numerical aperture is larger than 0.7, the transmission coefficient of the P-polarized light is larger than that of the S-polarized light, so that the pitch or size of the photoresist pattern are changed while the orientation of the pattern is changed.

FIG. 1 shows a polarization direction of P-/S-polarized light and Y-directional pattern 102 and X-directional pattern 104 on a photomask 100. The electric polarization directions of the P-polarized light and the S-polarized light are X-direction and Y-direction, respectively. The Y-directional pattern 102 has a same pitch a as that of the X-directional pattern.

In FIG. 2A, the intensity profile of a photoresist layer (not shown) caused by the Y-directional pattern 102 is shown. As shown in FIG. 2A, the Y-directional pattern 102 is in the same direction as the polarization direction of the S-polarized light, so that the distribution of the intensity profile 202s of the S-polarized light 202s is narrower than distribution of the intensity profile 202p of the P-polarized light. As a result, the integration of the intensity profile 202p is larger than that of the intensity profile 202s. That is, the total intensity profile 212 of the Y-directional pattern 102 is determined by the wider intensity profile 202p.

In FIG. 2B, the intensity profile of the photoresist layer caused by the X-directional pattern 104 is shown. As shown in FIG. 2B, since the X-directional pattern is in the polarization direction of the P-polarized light, the distribution of intensity profile 204p of the P-polarized light is narrower than the distribution of the intensity profile 204s of the S-polarized light. On the words, since the transmission coeffient of the P-polarized light is larger than that of the S-polarized light, the integration of the intensity profile 204p is thus larger than that of the intensity profile 204s. Simply speaking, the total intensity profile 214 is determined by the intensity profile 204p with a narrower distribution.

Referring to FIGS. 2A and 2B, the total intensity profile 212 of the Y-directional pattern 102 is determined by the wider intensity profile 202p, and the total intensity profile 214 of the X-directional pattern 104 is determined by the narrower intensity profile 204p. Therefore, the total intensity profile 212 is larger than the total intensity profile 214. As a result, when a positive photoresist is used, under a certain threshold exposure intensity $E_{th}$, of the photoresist pattern pitch $b_X$ of the X-directional pattern 104 is smaller than the photoresist pattern pitch $b_Y$ of the Y-directional pattern 102.

To resolve the above deviation, an optical system with a high numerical aperture is used to correction before performing the photolithography process. However, the current optical proximity correction model is designed to calculate the scalar of the incident only. The vector of the incident light (P/S polarized light) is not considered. Therefore, the difference in intensity profile caused by difference of transmission coefficient for P-/S-polarized light and pattern orientation cannot be compensated. The pitch and size of the resultant pattern is varied by the orientation change, so that deviation of different ratio occurs.

SUMMARY OF THE INVENTION

The invention provides a method of optical proximity correction, applicable to a photolithography process with a larger numerical aperture. The transmission coefficient of the P-polarized light is larger than that of the S-polarized light. According to the different pattern orientations of different patterns, different optical proximity correction model is used to correct. While correcting any pattern, the ratio of transmission coefficient of the P-polarized light to the S-polarized light, the pattern orientation of the pattern, and the polarization directions of the P-polarized light and the S-polarized light are considered.

The invention provides a method of optical proximity correction applicable to a photolithography process that employs a light source having P-polarized light and S-polarized light and a photomask comprising a plurality of patterns, wherein the P-polarized light has a transmission coefficient larger than that of the S-polarized light, and two patterns with different orientations are selected. Different optical proximity correction models are used to correct the patterns according to a ratio of the transmission coefficient between the P-polarized light and S-polarized light, the orientations of each pattern, and an angle between polarization directions of the P-polarized light and S-polarized light.

The invention provides a photolithography process. After a photoresist layer is formed on a substrate, an exposure step is performed using a photomask corrected by the above method of optical proximity correction. The photoresist layer is then developed to obtain the photoresist pattern.

In the above optical proximity correction method and the photolithography process, a hammerhead or a serif can be used for the correction. Or alternatively, the pattern linewidth can be adjusted for correction. In addition, the correction model includes either one of an optics model and an experiment model, or a combination of these two models. The former is obtained by optical algorithm to calculate, while the latter is achieved by the experimental error test-correction method.

As mentioned above, the invention considers the orientation of each pattern to adopt different optical proximity correction model. With a high numerical aperture, when the P-polarized light has a transmission coefficient larger than that of the S-polarized light, the influence by the P- and S-polarized light to each pattern with different orientation can be precisely calculated, and the correction can be performed.

Both the foregoing general description and the following detailed description are exemplary and explanatory only and are not restrictive of the invention, as claimed.

BRIEF DESCRIPTION OF THE DRAWINGS

FIG. 1 shows the electric polarization direction of P-/S-polarized light and the conventional X- and Y-directional patterns on a photomask before being corrected;

FIGS. 2A and 2B show the intensity profile, the total intensity profile and the corresponding pattern pitch of a photoresist layer for a P-/S-polarized light penetrating through Y-/X-directional patterns;

DESCRIPTION OF THE PREFERRED EMBODIMENTS

Figure 3:
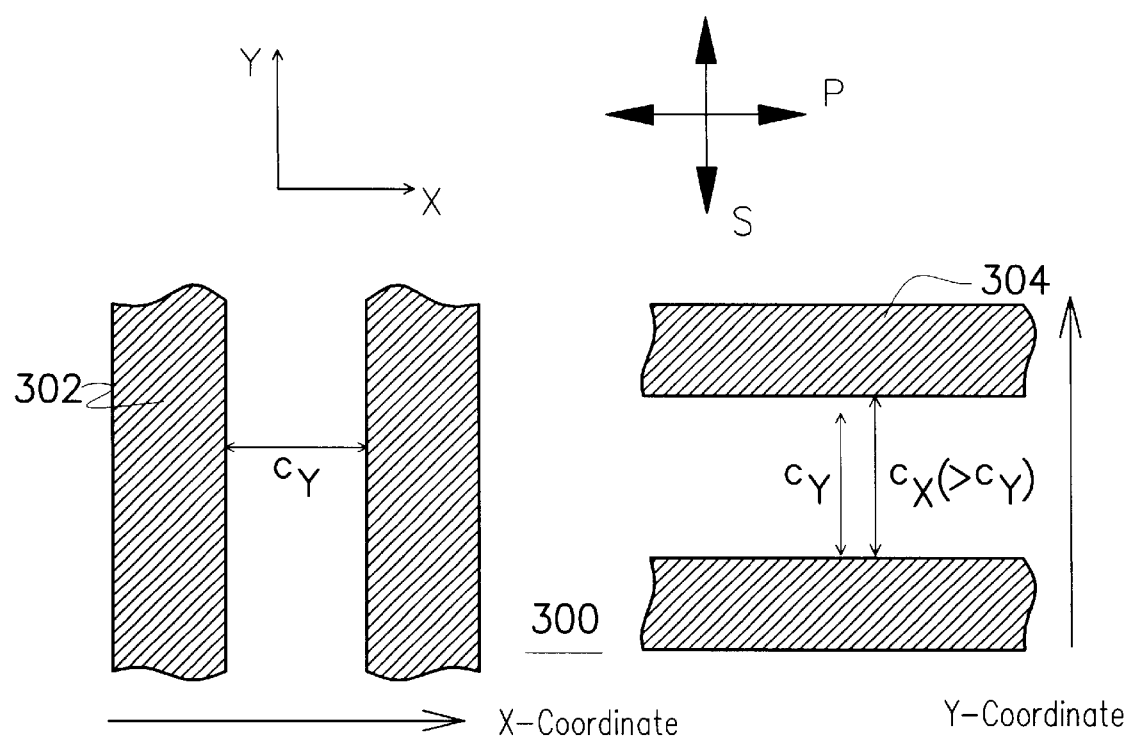
FIG. 3 shows the electric polarization direction of P-/S-polarized light and the corrected Y- and X-directional patterns according to the invention.

FIG. 3 shows the polarization direction of the P-/S-polarized light, and the corrected Y-direction pattern 302 and the corrected X-directional pattern 304. The Y-directional pattern 302 and the X-directional pattern 304 include a parallel line pattern. The correction target is to obtain the same pitch/size for Y-directional and X-directional photoresist patterns (not shown, but can be observed from FIGS. 4A and 4B).

Figures 4A, 4B:
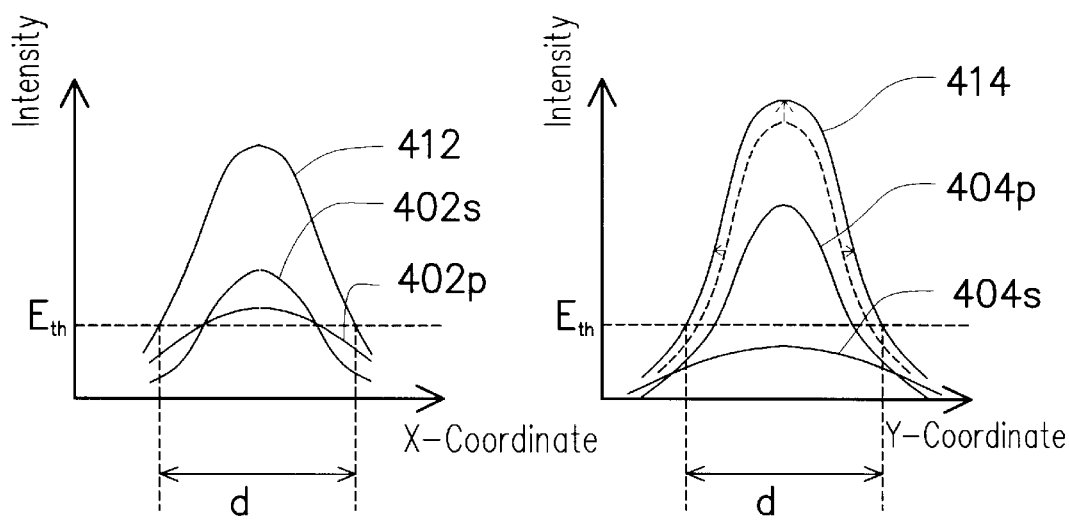
FIG. 4A and FIG. 4B show the intensity profile, the total intensity profile and the corresponding pattern pitch or size of a photoresist layer for a P-/S-polarized light penetrating through the corrected Y-/X-directional patterns

Referring FIGS. 3, 4A and 4B, to easily compare the difference of optical proximity correction model required for the Y- and X-directional pattern 302 and 304, the pitch $c_Y$ of the Y-directional pattern 302 is used as a reference. The variation of the pitch $c_X$ of the X-directional pattern 304 is then discussed. It is assumed that the pitch $c_Y$ of the Y-directional pattern 302 has been corrected with the optical proximity correction. With a certain threshold exposure intensity, the total intensity profile 412 (obtained by combining the intensity profiles 402$p$ and 402$s$) results in that the Y-directional photoresist pattern has a predetermined pitch/size d (while the positive or negative photoresist is used), as shown in FIG. 4A.

Comparing FIGS. 1, 2A and 2B, since the total intensity profile 214 of the X-directional pattern 104 has a distribution narrower than the total intensity profile 212 of the Y-directional pattern 102 with the same pitch (a), the pitch $b_X$ is larger than the pitch $b_Y$. Therefore, the pitch $c_X$ of the X-directional pattern has to be slightly larger than $c_Y$. Only by correction, the total intensity profile 414 of the X-directional pattern 304 can be widened (By adding the widened intensity profile 404$p$ of the P-polarized light with the intensity profile 404$s$ of the S-polarized light), and the size of the photoresist pattern is predetermined as d. In addition, FIG. 4B shows a dash line to represent the total intensity profile caused by the uncorrected X-directional pattern to shows the size variation of the total intensity profile.

The invention considers the intensity difference between two pattern directions and between P- and S-polarized lights. Different optical proximity correction models are used to correct the Y-directional pattern and the X-directional pattern. As a result, the effect on the Y- and X-directional pattern of the photomask from the P- and S-polarized lights can be exactly calculated and corrected.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of optical proximity correction, applicable to a photolithography process that employs a light source having P-polarized light and S-polarized light and a photomask comprising a plurality of patterns, wherein the P-polarized light has a transmission coefficient larger than that of the S-polarized light, and two patterns with different orientations are selected, the method comprising:

using different optical proximity correction models to correct each pattern according to a ratio of the transmission coefficient between the P- and S-polarized lights, the orientations of each pattern, and an angle between polarization directions of the P- and S-polarized lights so that said plurality of patterns can be transferred onto a photoresist layer by performing a single exposure step.

2. The method according to claim 1, wherein a plurality of correction patterns is used, the correction patterns includes a hammerhead correction pattern.

3. The method according to claim 1, wherein a plurality of correction patterns is used, the correction patterns includes a serif correction pattern.

4. The method according to claim 1, wherein the optical proximity correction includes an optical model.

5. The method according to claim 1, wherein the optical proximity correction includes an experiment model.

6. The method according to claim 1, wherein the patterns are distinguished into a first and a second patterns with two different pattern orientations.

7. The method according to claim 6, wherein the first pattern has an orientation perpendicular to that of the second pattern.

8. The method according to claim 6, wherein the first and second patterns include parallel line patterns.

9. The method according to claim 8, wherein the first pattern has a pitch/size the same as that of the second pattern.

10. The method according to claim 9, wherein:

the first pattern is oriented perpendicular to the second pattern;

the orientation of the first pattern is close to an electric polarization direction of the S-polarized light; and the second pattern after being corrected with the optical proximity correction has a pitch larger than a pitch of the first pattern after being corrected.

11. A photolithography process, comprising:

providing a substrate;

forming a photoresist layer on the substrate;

providing an exposure light source with a S-polarized light and a P-polarized light with a transmission coefficient larger than that of the S-polarized light; and providing a photomask with a plurality of patterns, wherein any two of the patterns have different orientation, and each pattern has been corrected with different optical proximity correction model considering a ratio of transmission coefficient between the P- and S-polarized lights, the orientation of each pattern and an angle between the polarization directions of the P- and S-polarized directions, so that said plurality of patterns can be transferred onto the photoresist layer by performing a single exposure step using the exposure light source.

12. The photolithography process according to claim 11, wherein the optical proximity correction models use a plurality of correction patterns that include a hammerhead pattern.

13. The photolithography process according to claim 11, wherein the optical proximity correction models use a plurality of correction patterns that include a serif pattern.

14. The photolithography process according to claim 11, wherein the optical proximity correction models include an optical model.

15. The photo lithography process according to claim 11, wherein the optical proximity correction model includes an experiment model.

16. The photolithography process according to claim 11, wherein the patterns are distinguished into a first and a second patterns with two different pattern orientations.

17. The photolithography process according to claim 16, wherein the first patterns have an orientation perpendicular to that of the second patterns.

18. The photolithography process according to claim 16, wherein the first and second patterns include parallel line patterns.

19. The photolithography process according to claim 18, wherein the photoresist patterns are distinguished into first photoresist patterns corresponding to the first patterns and second photoresist patterns corresponding to the second patterns, and the first and second photoresist patterns have a same pitch/size.

20. The photolithography process according to claim 19, wherein:

the first patterns are oriented perpendicular to the second patterns;

the orientation of the first patterns is close to an electric polarization direction of the S-polarized light; and the second patterns after being corrected with the optical proximity correction have a pitch larger than a pitch of the first patterns after being corrected.

21. A method of optical proximity correction, applicable to a photolithography process that employs a light source having P-polarized light and S-polarized light and a photomask comprising at least a first pattern having a first pitch along a first direction and a second pattern having a second pitch along a second direction, wherein said first pitch is same as said second pitch, and wherein the P-polarized light has a transmission coefficient larger than that of the S-polarized light, the method comprising:

using different optical proximity correction models to enlarge said second pitch such that said second pitch is larger than said first pitch so that a total intensity profile of said second pattern can be widened.

* * * * *